(12) United States Patent
Fautz

(10) Patent No.: US 11,662,407 B2
(45) Date of Patent: May 30, 2023

(54) GENERATION OF MEASUREMENT DATA FROM A TARGET VOLUME OF AN EXAMINATION SUBJECT USING A MAGNETIC RESONANCE SYSTEM

(71) Applicant: Siemens Healthcare GmbH, Erlangen (DE)

(72) Inventor: Hans-Peter Fautz, Forchheim (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/488,598

(22) Filed: Sep. 29, 2021

(65) Prior Publication Data

US 2022/0099772 A1 Mar. 31, 2022

(30) Foreign Application Priority Data

Sep. 29, 2020 (DE) .......................... 102020212288.1

(51) Int. Cl.
*G01R 33/48* (2006.01)
*G01R 33/561* (2006.01)

(52) U.S. Cl.
CPC ...... *G01R 33/4824* (2013.01); *G01R 33/5611* (2013.01); *G01R 33/5618* (2013.01)

(58) Field of Classification Search
CPC ............ G01R 33/4824; G01R 33/5611; G01R 33/5618; G01R 33/482; G01R 33/561; G01R 33/4828

See application file for complete search history.

(56) References Cited

U.S. PATENT DOCUMENTS

| 8,570,034 | B2 * | 10/2013 | Stemmer | G01R 33/246 324/309 |
| 2005/0237057 | A1 | 10/2005 | Porter | |
| 2006/0261810 | A1 * | 11/2006 | Fautz | G01R 33/56375 324/309 |
| 2010/0308824 | A1 * | 12/2010 | Grady | G01R 33/5611 324/309 |
| 2014/0035579 | A1 * | 2/2014 | Paul | G01R 33/561 324/309 |

(Continued)

FOREIGN PATENT DOCUMENTS

DE 102004017852 A1 11/2005

OTHER PUBLICATIONS

Lustig, Michael et al. "Compressed sensing MRI", IEEE signal processing magazine, 2008, 25. Jg., Nr. 2, S. 72-82. DOI: https://doi.org/10.1109/MSP.2007.914728.

(Continued)

*Primary Examiner* — Susan S Lee
(74) *Attorney, Agent, or Firm* — Banner & Witcoff Ltd.

(57) ABSTRACT

In a method and system for the generation of measurement data required k-space is read out in the readout direction in k-space rows such that at least a first k-space row of the k-space rows does not cover the k-space to be read out in the readout direction in full and at least a second k-space row of the k-space rows covers the k-space to be read out in locations in the readout direction at which the first k-space row does not cover the k-space to be read out. Measurement data that is missing in the k-space is completed in this way on the basis of recorded echo signals stored as measurement data.

16 Claims, 6 Drawing Sheets

(56) References Cited

U.S. PATENT DOCUMENTS

2014/0152303 A1* 6/2014 Wang .................. G01R 33/561
                                                         324/309

OTHER PUBLICATIONS

Liu, Jing et al., "Accelerated MRI with CIRcular Cartesian UnderSampling (CIRCUS): a variable density Cartesian sampling strategy for compressed sensing and parallel imaging", Quantitative imaging in medicine and surgery, 2014, 4. Jg., Nr. 1, S. 57. DOI: https://doi.org/10.3978/j.issn.2223-4292.2014.02.01.
German action dated Aug. 26, 2021, Application No. 10 2020 212 288.1.

* cited by examiner

GENERATION OF MEASUREMENT DATA FROM A TARGET VOLUME OF AN EXAMINATION SUBJECT USING A MAGNETIC RESONANCE SYSTEM

CROSS REFERENCE TO RELATED APPLICATIONS

This patent application claims priority to German Patent Application No. 10 2020 212 288.1, filed Sep. 29, 2020, which is incorporated herein by reference in its entirety.

BACKGROUND

Field

The disclosure relates to a method for the generation of measurement data from a target volume of an examination subject using a magnetic resonance system by means of the asymmetric acquisition of echo signals.

Related Art

Magnetic resonance technology (the abbreviation MR is used in the following to denote magnetic resonance) is a known technology using which images can be generated of the inside of an examination subject. Expressed in simplified terms, this is done by positioning the examination subject in a magnetic resonance device in a relatively strong static, homogeneous main magnetic field, also referred to as a $B_0$ field, with field strengths of from 0.2 tesla to 7 tesla or more, so that the nuclear spins of the examination subject align along the main magnetic field. In order to trigger nuclear spin resonance that can be measured as (echo) signals, radio frequency excitation pulses (RF pulses) are applied to the examination subject and the nuclear spin resonance triggered is then measured as what is referred to as k-space data and used to reconstruct MR images or determine spectroscopic data. Rapidly switched magnetic gradient fields, often abbreviated to just gradients, are superimposed on the main magnetic field for spatial encoding of the measurement data. A scheme used which describes a temporal succession of RF pulses to be applied and gradients to be switched is referred to as a pulse sequence (scheme) or, in abbreviated form, just as a sequence. The measurement data recorded is digitized and stored in a k-space matrix in the form of complex numerical values. The k-space matrix populated with values can be used to reconstruct an associated MR image, for example by applying a Fourier transform.

There are many magnetic resonance tomography applications in which it is desirable to be able to distinguish between different tissue types.

Tissue types with differing chemical shifts end up with a different magnetic field in the nucleus, which makes their resonance frequencies differ as well. This causes the two components to have different phase angles when the signal is acquired. The most prominent examples of two different tissue types in the echo signal are fat and water, although this situation can also arise in other applications as well. The resonant frequencies of fat and water differ by approximately 3.3 ppm (parts per million). One way to separate out the signals from two different tissue types, such as fat and water, for example, is to refer to the phase information of recorded MR signals.

It is customary in this connection in conventional methods for distinguishing between tissues dominated by water and tissues dominated by fat to record two (or more) echo signals per pixel. Such methods, which are known, for example, as two-point Dixon techniques or similar, record for each pixel an echo signal in which one phase of the echo signal of a water-containing tissue has a first phase angle relative to the phase of the echo signal of a fat-containing tissue, for example a phase that is the same as the phase of an echo signal of a fat-containing tissue, and an echo signal in which one phase of an echo signal of the water-containing tissue has a second phase angle relative to the phase of the echo signal of a fat-containing tissue, for example a phase that is the opposite of the phase of the echo signal of the fat-containing tissue. Using the two echo signals per pixel, it is then possible to distinguish between tissue dominated by water and tissue dominated by fat.

Two-point Dixon techniques for the separation of fat and water components are used in many diagnostic situations including abdominal MR imaging and MR mammography.

The acquisition duration can generally by reduced using what are known as partial Fourier (PF) techniques. PF techniques usually involve sampling (that is to say recording, measuring, scanning or acquiring) less than the entire k-space. An example of partial scanning of a k-space according to a PF technique is shown in FIG. 1, in which k-space rows are in each case read, in the readout (RO) direction $k_x$, only at the locations marked by dots in the diagram. This takes place in the same way for all phase encodings (PE) in phase-encoding direction $k_y$. A generated echo signal using such a technique is thus read out not in full but rather in truncated form (with a readout duration that is shorter than the duration of the echo signal) and is asymmetric with respect to the center of the echo signal. The k-space is thus also scanned asymmetrically, the center of the k-space ($k_x$=0) advantageously always being included in sampling. Such acquisition techniques are also referred to as asymmetric acquisition techniques.

Reducing the readout duration makes it possible, in particular with a low readout bandwidth, to reduce the repetition time TR to be applied for the acquisition of the echo signals and thus the overall duration for the full acquisition of all required echo signals as compared with conventional methods. Such a reduction of the readout duration in conjunction with Dixon techniques can also be an advantage if, for example, there is only a short period available to acquire one of the two echo signals with different phase angles present before it is time to acquire the echo signal with the other phase angle. This can be the case especially with magnetic resonance systems that have a small main magnetic field strength, for example less than 1 tesla, if the echo time after which the first required echo signal forms is so close to the echo time after which the second required echo signal forms that it is not possible to read out both echo signals fully in the given time. If at the same time a low readout bandwidth is to be applied, for example in order to exploit the time between an excitation and the formation of the echo signal as thoroughly as possible, and/or in order to realize an increased signal-to-noise ratio (SNR), the acquisition duration is further increased so that it becomes more attractive to apply a reduced acquisition duration.

Various reconstruction methods are applied to fill in the part of the k-space that is left unmeasured with a reduced acquisition duration. A method known as "zero-filling" fills in the parts of the k-space that were not sampled with zeros or null values. This method is very simple but usually results in additional or enlarged blurring and thus in reduced resolution in the resulting magnetic resonance image as compared with imaging techniques that record the entire k-space.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
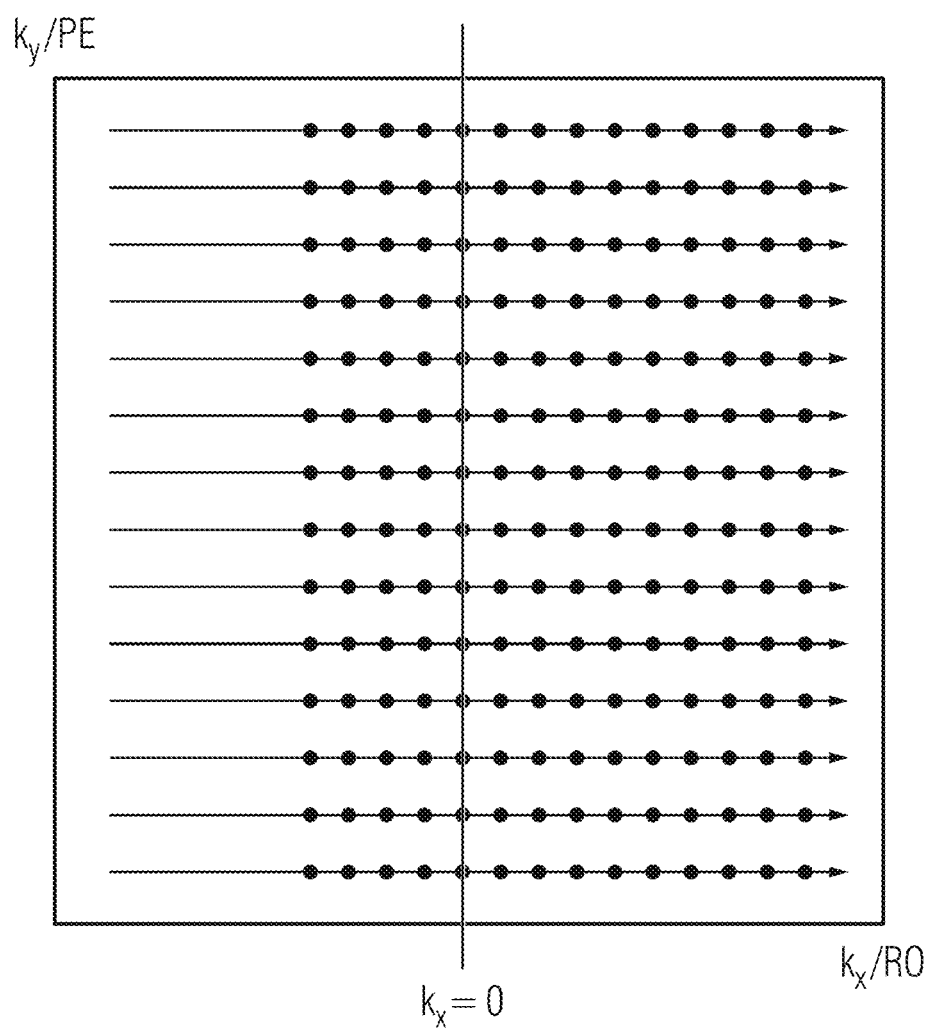
FIG. 1 shows an example of the incomplete sampling of k-space according to a PF technique.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to enable a generation of measurement data using a magnetic resonance system with short readout durations and high image resolution.

The object is achieved by a method for the generation of measurement data of an examination subject using a magnetic resonance system, a magnetic resonance system, a computer program, and an electronically readable data carrier, according to exemplary embodiments of the present disclosure.

In an exemplary embodiment, a method for the generation of measurement data from a target volume of an examination subject using a magnetic resonance system includes:

reading out of a k-space corresponding to the target volume to acquire one set of measurement data, including: a) application of at least one RF excitation pulse to excite spins in a target volume of the examination subject, b) switching of gradients for spatial encoding and/or manipulation of the excited spins such that echo signals generated by applied RF pulses and switched gradients can be read out along k-space rows, and c) acquisition of echo signals and storage of these echo signals as measurement data along the k-space rows extending in the readout direction and specified by the switched gradients, at least a first k-space row of the k-space rows along which echo signals are acquired and stored as measurement data not fully covering the k-space to be read out in the readout direction so that the set of stored measurement data is incomplete and at least a second k-space row of the k-space rows along which echo signals are acquired and stored as measurement data covering the k-space to be read out in locations in the readout direction at which the first k-space row does not cover the k-space to be read out, completion of missing measurement data in the incomplete set of measurement data on the basis of measurement data of acquired echo signals so that a full set of completed measurement data is created, and reconstruction of image data (BD) on the basis of the set of completed measurement data.

Scanning of the k-space according to the disclosure such that at least a first k-space row does not fully cover the k-space in the readout direction makes a reduced readout duration possible. The fact that at least a second of the k-space rows covers the k-space in locations in the readout direction at which measurement data is missing in the first k-space row makes it possible for the recorded echo signals stored as measurement data to be used to complete measurement data that is missing in k-space rows. A loss of resolution in image data reconstructed from the completed measurement data can thus be avoided.

A magnetic resonance system according to an exemplary embodiment of the disclosure includes a magnet unit, a gradient unit, a radio frequency unit and a controller, having a coverage determination unit, which is configured to perform a method according to the disclosure.

A computer program according to the disclosure implements a method according to the disclosure on a controller when it is executed on the controller.

The computer program here can also take the form of a computer program product that can be loaded directly into a memory of a controller and has program code resources to execute a method according to the disclosure when the computer program product is executed in the processor of the computing system.

An electronically readable data carrier according to the disclosure includes electronically readable control information stored thereon that includes at least a computer program according to the disclosure and is in such a form that it performs a method according to the disclosure when the data carrier is used in a controller of a magnetic resonance system.

The advantages and observations presented in relation to the method also apply analogously to the magnetic resonance system, the computer program product and the electronically readable data carrier.

Figure 2:
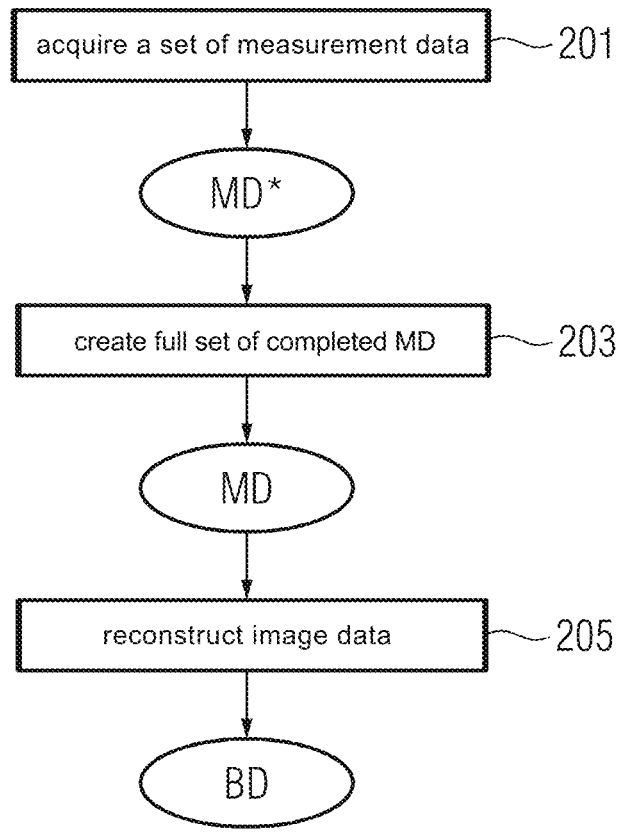
FIG. 2 shows a schematic flowchart of a method according to an exemplary embodiment of the disclosure.

FIG. 2 is a schematic flow diagram of a method according to an exemplary embodiment of the disclosure for the generation of measurement data from a target volume of an examination subject using a magnetic resonance system.

A k-space corresponding to the target volume is sampled to acquire a set of measurement data MD* (block 201).

At least one RF excitation pulse is for this purpose applied to a target volume of the examination subject to excite spins. This can be done in a known manner.

The gradients to be switched for spatial encoding and/or manipulation of the excited spins are switched such that echo signals generated by applied RF pulses and switched gradients can be read out along k-space rows. Echo signals are acquired along the k-space rows extending in the readout direction and specified by the switched gradients and are stored as measurement data MD*. At least a first k-space row of the k-space rows along which echo signals are acquired and stored as measurement data MD* does not in this instance fully cover the k-space to be read out in the readout direction so that the set of stored measurement data MD* is incomplete. In addition, at least a second k-space row of the k-space rows along which echo signals are acquired and stored as measurement data MD* covers the k-space to be read out in locations in the readout direction at which the first k-space row does not cover the k-space to be read out.

Examples of such coverage of the k-space to be read out are presented below with reference to FIGS. 3 to 5.

Missing measurement data in the incomplete set of measurement data MD* is completed on the basis of measurement data MD* of acquired echo signals so that a full set of completed measurement data MD is created (block 203).

Image data BD can be reconstructed on the basis of the set of completed measurement data (block 205).

The image data BD and/or the measurement data MD* and/or the completed measurement data MD may, for example, be stored in a memory of a magnetic resonance system and/or displayed on an input/output facility E/A of the magnetic resonance system.

Figure 3:
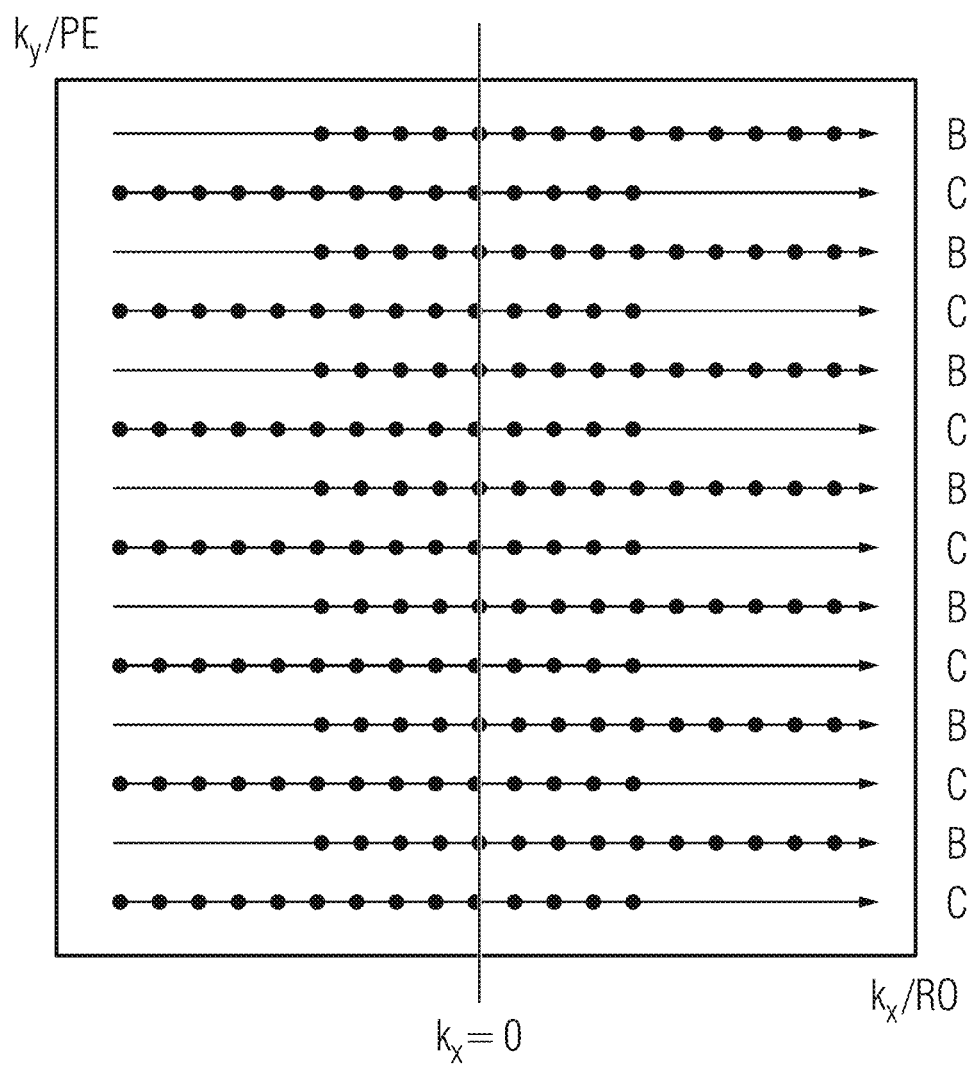
FIG. 3 shows an example of the incomplete sampling of a k-space according to a method according to an exemplary embodiment of the disclosure.

FIG. 3 shows an example of the incomplete sampling of a k-space according to a method according to an exemplary embodiment of the disclosure. As in FIG. 1, k-space rows are in each case read, in the readout (RO) direction $k_x$, only at the locations marked by dots in the diagram. This is done in the example presented for every second phase encoding (PE) in the phase-encoding direction $k_y$, that is to say for every second k-space row (for example every k-space row marked B or every k-space row marked C) in the same way, but not in the same way for adjacent k-space rows.

The example presented thus shows one possible asymmetric sampling scheme that samples the k-space with the k-space center $k_x=0$ alternately displaced to the right and the left in the readout direction from k-space row to k-space row.

Generally, the k-space rows used along which echo signals are acquired and stored as measurement data can cover the k-space to be acquired asymmetrically in the readout direction (in respect of the k-space center in the readout direction, that is to say the central k-space location $k_x=0$) in the readout direction.

In this context, as also shown in the example presented, k-space rows along which echo signals are acquired and stored as measurement data that are adjacent in the phase-encoding direction can cover the k-space to be acquired, in an alternating manner in the readout direction, asymmetrically before (C) and after (B) the k-space center in the readout direction.

Each k-space row along which echo signals are acquired and stored as measurement data here covers the central area in the readout direction of the k-space to be read out ($k_x=0$). The k-space is thus sampled alternately and asymmetrically in the phase-encoding direction $k_y$, the k-space center ($k_x=0$) advantageously always being included in sampling because the k-space center is very important for the contrast of the image data reconstructed from the measurement data.

It is possible that, as also shown in the example presented, all k-space rows along which echo signals are acquired and stored as measurement data cover the k-space to be read out incompletely in the readout direction. It is also conceivable, however, that least one k-space row covers the k-space in full in the readout direction (not shown in FIG. 3), with the echo signals being acquired as measurement data over the entire length of the relevant k-space row in the required k-space.

A general procedure can be adopted here according to which k-space rows along which echo signals are acquired and stored as measurement data that are adjacent in the phase-encoding direction cover the k-space to be acquired in different ways in the readout direction. In addition to the example, already described, of the alternating displacement of the coverage in the readout direction, a change to the readout duration and thus to the number of k-space points acquired in a k-space row and/or a different manner of displacement of the asymmetry applied, for example displacement in more than two stages, are also conceivable.

One possibility here is to adopt a procedure according to which k-space rows along which echo signals are acquired and stored as measurement data that are adjacent in the phase-encoding direction cover the k-space to be acquired in different ways in the readout direction in a manner that follows a regular pattern, as is also the case with the example shown in FIG. 3, in which k-space points in every second k-space row are regularly not acquired. The missing measurement data from k-space points not acquired is thus evenly distributed in the k-space.

It is also possible, however, to adopt a procedure according to which k-space rows along which echo signals are acquired and stored as measurement data that are adjacent in the phase-encoding direction cover the k-space to be acquired in different ways in the readout direction in a manner that is as incoherent as possible. This can be achieved, for example, by means of a more pronounced variation, already described above, in the manner in which the individual k-space rows are sampled in the readout direction. The missing measurement data from k-space points not acquired is thus incoherently distributed in the k-space.

Using a parallel acquisition technique or an iterative reconstruction technique, measurement data not acquired with an acquisition scheme of this type can be completed with the aid, inter alia, of the acquired measurement data of adjacent k-space rows, the image data reconstructed from the completed measurement data not necessarily having any loss of resolution relative to acquisition techniques having no reduction of readout durations.

Parallel acquisition techniques (PAT) with which missing measurement data can be completed can include, by way of example, GRAPPA ("Generalized Autocalibrating Partially Parallel Acquisition") and SENSE ("Sensitivity Encoding"), in which, using multiple RF coils, only a number of measurement data points undersampled according to the Nyquist theorem are acquired in the k-space. The missing measurement data for k-space points not sampled is completed here from the measurement data measured on the basis of sensitivity data of the RF coils used and calibration data sampled in full according to Nyquist in a sub-area of the k-space actually to be sampled for the measurement.

Stored measurement data of echo signals acquired in the central k-space to be acquired can be used here as calibration data for the parallel acquisition technique. This removes the need to acquire additional calibration data. A parallel acquisition technique is particularly suitable for completing missing measurement data for k-space points not acquired that are evenly distributed in the k-space to be acquired in a manner as described above, in particular only in peripheral areas in the readout direction.

It is also conceivable for undersampling to be applied in the phase-encoding direction by, for example, not acquiring every second phase encoding and applying a sampling scheme as described herein in the k-space rows of the remaining phase encodings. A k-space to be sampled can in this way be undersampled to a greater degree in the peripheral areas in the readout direction than in central areas. Here too, missing measurement data can be completed using parallel acquisition techniques, with there being a higher PAT factor in the peripheral areas than in the central areas, or using iterative reconstruction techniques.

Possible iterative reconstruction techniques that can be used to complete missing measurement data include, in particular, what are known as compressed sensing techniques. Compressed sensing or compressed sampling is a statistical technique for data recording that aims to sample relatively few measurement points in the k-space. Under certain conditions, these sparingly recorded measurement points in the k-space can nevertheless reproduce almost all of the information, which, without compressed sampling, can only be reconstructed by means of the acquisition of all measurement points in the k-space. A signal model of the measurement data stored for the echo signals recorded is known and can be used for an iterative reconstruction technique.

Missing measurement data for k-space points not acquired that are distributed incoherently in the k-space to be acquired as described above can be completed particularly advantageously using iterative reconstruction techniques.

Figure 4A:
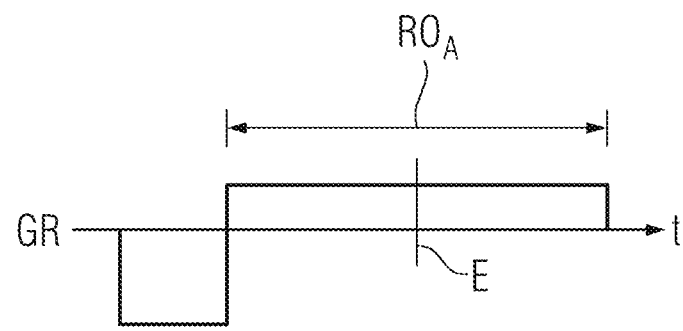
FIGS. 4A-4C show a comparison of examples of gradients to be switched in the readout direction as could be used for a method according to exemplary embodiments of the disclosure.
Figure 4B:
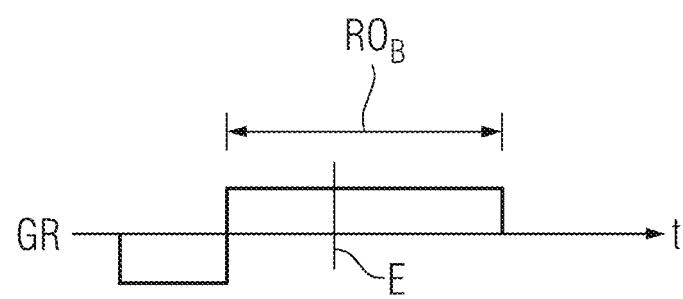
Figure 4C:
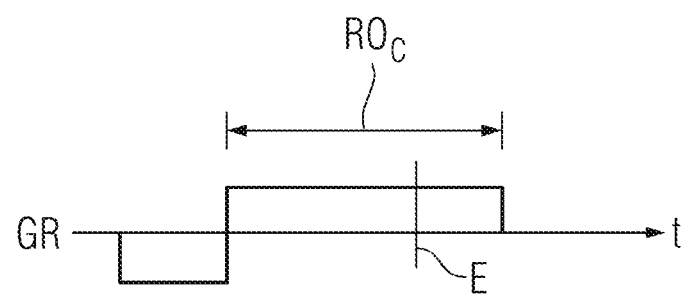

FIG. 4A-4C show a comparison of examples of gradients to be switched in the readout direction as could be used for a method according to exemplary embodiments of the disclosure.

The examples of FIGS. 4A, 4B, and 4C each show, in diagrammatic form, gradients to be switched in the readout direction GR, each of which generates a gradient echo E and that sample the k-space in the readout direction along k-space rows. Other gradients to be switched in the phase-encoding direction and, where applicable, the slice-selection direction, and RF-pulses to be applied are known in principle and, for the sake of clarity, are accordingly not shown.

Symmetrical, in particular complete, acquisition of the generated gradient echo is shown in example A of FIG. 4A. The readout duration $RO_A$ correspondingly extends symmetrically before and after the echo time E. Example A corresponds in the k-space to the sampling of a full k-space row.

Example B of FIG. 4B and Example C of FIG. 4C, in contrast, each show asymmetric and incomplete acquisition of the relevant gradient echo. The respective readout durations $RO_B$ and $RO_C$ are shorter than the readout duration $RO_A$ in example A.

In example B of FIG. 4B, acquisition is shorter before the echo time E than after the echo time E so that a k-space row in the k-space is sampled that has fewer k-space points to the right of the central k-space point $k_x=0$ in the readout direction than it does to the left of $k_x=0$. A k-space row labeled B in FIG. 3 can be sampled in this way.

In example C of FIG. 4C, acquisition is longer before the echo time E than after the echo time E so that a k-space row in k-space is sampled that has more k-space points to the right of the central k-space point $k_x=0$ in the readout direction than it does to the left of $k_x=0$. A k-space row labeled C in FIG. 3 can be sampled in this way.

If k-space rows are used alternately with readout gradients according to examples B and C for adjacent phase encodings, the result is a sampling scheme as shown in FIG. 3.

In the case of acquisitions according to example B, the echo time after which the gradient echo forms is shorter than for acquisitions according to example C (the echo time E in example B is closer to the gradient shown with negative polarity than in example C). An acquisition with different echo times for different phase encodings can be undesirable for certain applications as the resulting contrast may change, for example. This can conceivably be avoided by alternately acquiring measurement data according to example A and according to example C, which have the same echo time, in k-space rows that are adjacent to each other in the phase-encoding direction. A corresponding sampling scheme for the k-space would result if the k-space rows labeled B in FIG. 3 were to be replaced with full k-space rows. This at least reduces the readout duration for the k-space rows acquired asymmetrically (according to example C) and with it the overall measurement time required.

Figure 5:
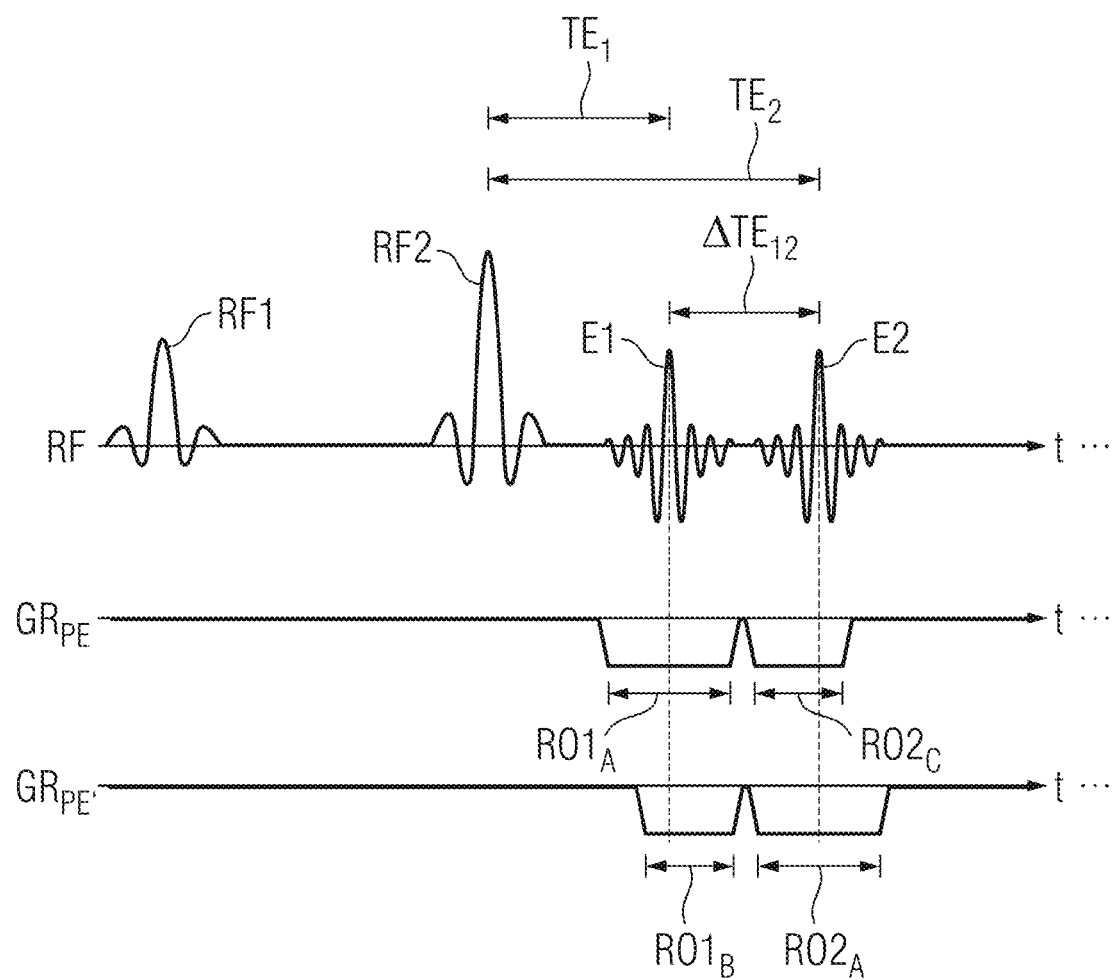
FIG. 5 shows portions of an exemplary pulse sequence scheme as could be used for a method according to an exemplary embodiment of the disclosure.

FIG. 5 shows, in diagrammatic form, parts of another exemplary pulse sequence scheme as could be used for a method according to an exemplary embodiment of the disclosure. In the example shown in FIG. 5, echo signals are generated by applying an RF excitation pulse RF1 and an RF refocusing pulse RF2. There are generated, for example as part of a Dixon method, a first echo signal E1 after a first echo time $TE_1$ following the RF refocusing pulse RF2 and a second echo signal E2 following a second echo time $TE_2$. As explained above, the difference $\Delta TE_{12}$ between the first echo time $TE_1$ and the second echo time $TE_2$ depends on factors including the chemical shift of two substances to be acquired using the Dixon technique.

Possible gradients to be switched in the readout direction GR are specified for different phase encodings PE and PE' in the lower two rows in FIG. 5.

In the example with phase encoding PE, a readout gradient of the readout duration $RO1_A$ is switched symmetrically for the full duration of the first echo signal E1. A k-space row can be sampled in full in this way. The second echo signal E2, however, is read out with an asymmetric readout gradient having a reduced readout duration $RO2_C$ switched, meaning that it is read out along an asymmetric, incompletely sampled k-space row (for example a k-space row corresponding to a k-space row labeled C in FIG. 3). This makes it possible to switch additional gradients and/or apply RF pulses faster after the completion of the readout gradient with duration $RO2_C$, for example in order to manipulate further the spins to be examined (for example to destroy unwanted signals).

In the example with phase encoding PE', a readout gradient of readout duration $RO2_A$ is switched symmetrically for the full duration of the second echo signal E2. A k-space row can be sampled in full in this way. The first echo signal E1, however, is read out with an asymmetric readout gradient having a reduced readout duration $RO1_B$ switched, meaning that it is read out along an asymmetric, incompletely sampled k-space row (for example a k-space row corresponding to a k-space row labeled B in FIG. 3). This leaves more time before the start of the readout gradient of duration $RO1_B$ to switch additional gradients and/or apply RF pulses, for example in order to manipulate further the spins to be examined (for example for saturation to avoid unwanted signals).

If, for example, the k-space rows to be acquired for a required measurement are acquired with readout gradients as shown for a phase encoding PE alternating with readout gradients as shown for a phase encoding PE', a k-space is obtained whose k-space rows are alternately complete and asymmetrically incomplete for both the first echo E1 and the second echo E2, it being possible to complete the missing measurement data as already described.

Many other variants for sampling the k-space with at least one k-space row sampled asymmetrically and incompletely are conceivable in the context of the method presented.

Figure 6:
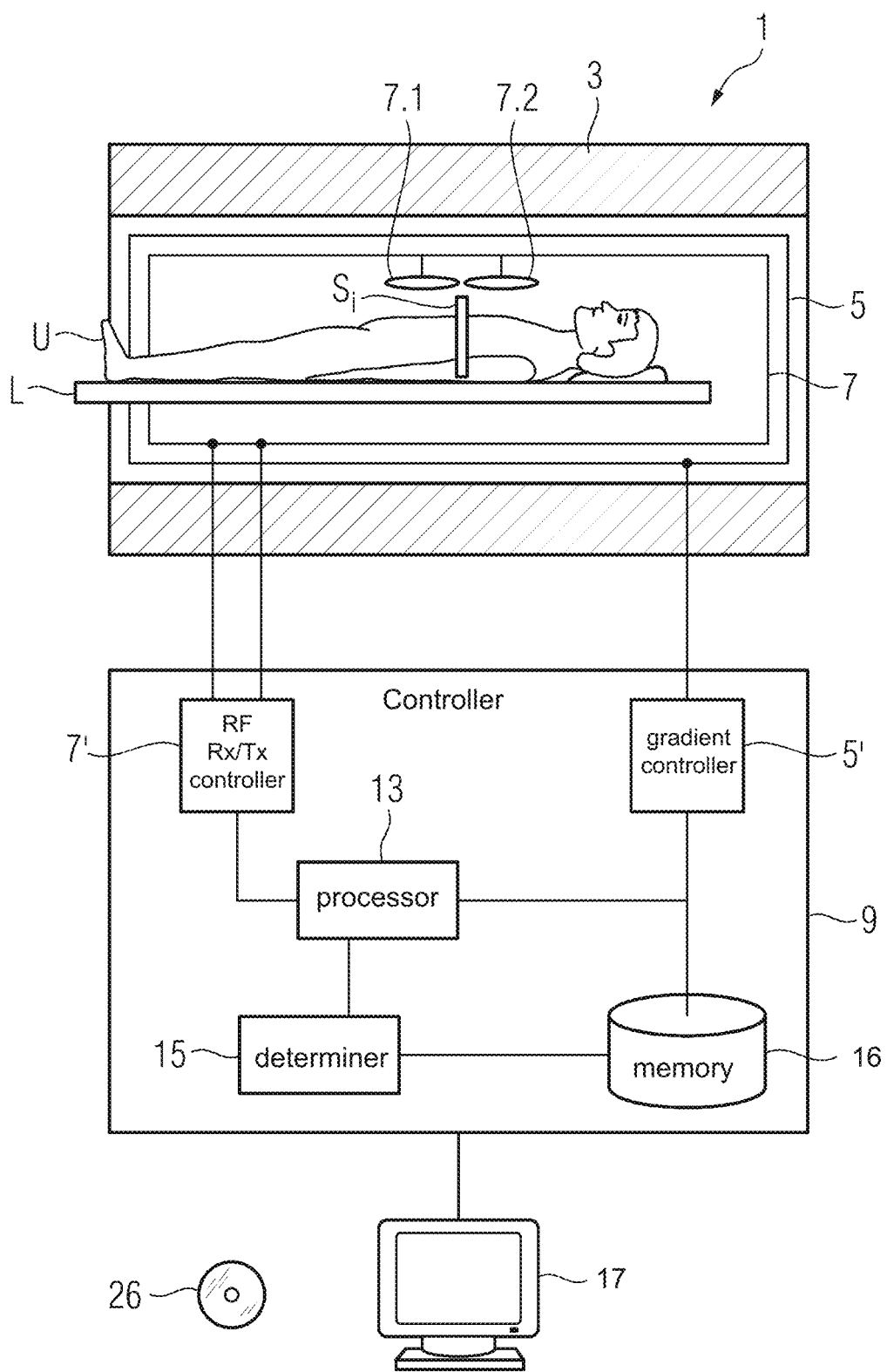
FIG. 6 shows a magnetic resonance system according to an exemplary embodiment of the disclosure.

FIG. 6 shows a magnetic resonance (MR) system according to an exemplary embodiment of the disclosure. This includes a MR scanner and a controller 9. The MR scanner includes a magnet unit 3 for the generation of the main magnetic field, a gradient unit 5 for the generation of the gradient fields, and a radio frequency unit 7 for the application and reception of radio frequency signals. The controller 9 is configured to perform a method according to the disclosure. In an exemplary embodiment, the controller 9 (and/or one or more of its components) includes processing circuitry that is configured to perform one or more functions of the controller 9 (and/or respective components therein).

These subunits of the magnetic resonance system 1 are only outlined in diagrammatic form in FIG. 6. The radio frequency unit 7 may in particular comprise multiple subunits, for example multiple coils such as coils 7.1 and 7.2 shown in diagrammatic form or more coils that may be designed just to emit radio frequency signals or just to receive the radio frequency signals triggered or for both.

An examination subject U to be examined, for example a patient or a phantom, may be introduced into the measurement volume of the magnetic resonance system 1 on a patient table L. The slice or slab $S_i$ represents an exemplary target volume of the examination subject from which data is to acquired and recorded as measurement data.

The controller 9 serves for the control of the magnetic resonance system 1 and can in particular control the gradient unit 5 by means of a gradient controller 5' and the radio frequency unit 7 by means of a radio frequency transceiver controller 7'. The radio frequency unit 7 may in this case include multiple channels on which signals can be sent or received.

The radio frequency unit 7 is responsible, together with its radio frequency transceiver controller 7', for the generation and the application (emission) of a radio frequency alternating field for the manipulation of the spins in an area to be manipulated (for example in slices S to be measured) of the examination subject U. The center frequency of the radio frequency alternating field, also referred to as the B1 field, is here usually adjusted as far as possible so that it is close to the resonant frequency of the spins to be manipulated. Discrepancies between the center frequency and the resonant frequency are referred to as off-resonance. Controlled currents are applied to the RF coils in the radio frequency (RF) unit 7 via the radio frequency (RF) transceiver controller 7' to generate the B1 field.

The controller 9 also includes a coverage determination unit (gradient processor) 15 with which gradients to be switched in connection with the recording of echo signals for sampling of the k-space according to the disclosure can be determined, which gradients can be realized via the gradient controller 5'. The controller 9 as a whole is able to perform a method according to the disclosure.

A processor 13 included in the controller 9 is able to perform all the computing operations necessary for the required measurements and determinations. Interim results and results required for or determined in the course of these operations can be stored in a memory 16 of the controller 9. The units presented are not necessarily to be understood here as physically separate units and merely represent a breakdown into functional units that may be implemented, for example, in fewer or even in just a single physical unit.

An input/output (I/O) device 17 of the magnetic resonance system 1 makes it possible, for example for a user, to direct control commands to the magnetic resonance system and/or display results from the controller 9, such as image data for example.

A method described herein may also take the form of a computer program product that includes a program and implements the method described on a controller 9 when it is executed on the controller 9. There may also be an electronically readable data carrier 26 with electronically readable control information stored thereon, which electronically readable control information includes at least a computer program product such as the one just described that is able to perform the method described when the data carrier 26 is used in a controller 9 of a magnetic resonance system 1.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generation of measurement data from a target volume of an examination subject using a magnetic resonance (MR) system, the method comprising:
    reading out of k-space, in a readout direction, corresponding to the target volume to acquire one set of measurement data, the reading out of k-space including:
        applying at least one radio frequency (RF) excitation pulse to excite spins in the target volume of the examination subject,
        switching gradients for spatial encoding and/or manipulating the excited spins such that echo signals generated by applied RF pulses and switched gradients can be read out along k-space rows extending in the readout direction, and
        acquiring echo signals and storing the acquired echo signals as measurement data along the k-space rows extending in the readout direction and specified by the switched gradients, wherein at least a first k-space row of the k-space rows along which echo signals are acquired and stored as measurement data does not fully cover k-space to be read out in the readout direction so that the set of stored measurement data is incomplete and at least a second k-space row of the k-space rows along which echo signals are acquired and stored as measurement data covers the k-space to be read out in locations in the readout direction at which the first k-space row does not cover the k-space to be read out;
    completing missing measurement data in the incomplete set of stored measurement data based on the measurement data of acquired echo signals to create a full set of completed measurement data; and
    reconstructing image data based on the set of completed measurement data.

2. The method as claimed in claim 1, wherein each k-space row along which echo signals are acquired and stored as measurement data covers a central area in the readout direction of k-space to be read out.

3. The method as claimed in claim 1, wherein k-space rows along which echo signals are acquired and stored as measurement data cover k-space to be acquired asymmetrically in the readout direction.

4. The method as claimed in claim 3, wherein k-space rows along which echo signals are acquired and stored as measurement data that are adjacent in a phase-encoding direction cover k-space to be acquired, in an alternating manner in the readout direction, asymmetrically before and after a k-space center in the readout direction.

5. The method as claimed in claim 1, wherein all k-space rows along which echo signals are acquired and stored as measurement data cover k-space to be acquired incompletely in the readout direction.

6. The method as claimed in claim 1, wherein k-space rows along which echo signals are acquired and stored as measurement data that are adjacent in a phase-encoding direction cover k-space to be acquired in different ways in the readout direction.

7. The method as claimed in claim 1, wherein k-space rows along which echo signals are acquired and stored as measurement data that are adjacent in a phase-encoding direction cover k-space to be acquired in different ways in the readout direction following a regular pattern.

8. The method as claimed in claim 1, wherein k-space rows along which echo signals are acquired and stored as measurement data that are adjacent in a phase-encoding direction cover k-space to be acquired in different ways in the readout direction in an incoherent manner.

9. The method as claimed in claim 1, wherein the missing measurement data is completed using a parallel acquisition technique (PAT).

10. The method as claimed in claim 9, wherein the stored measurement data of echo signals acquired is usable in a central k-space to be acquired as calibration data for the PAT.

11. The method as claimed in claim 1, wherein the missing measurement data is completed using an iterative reconstruction technique.

12. The method as claimed in claim 11, wherein the iterative reconstruction technique is a compressed sensing (CS) technique.

13. A computer program which includes a program and is directly loadable into a memory of the MR system, when executed by a processor of the MR system, causes the processor to perform the method as claimed in claim 1.

14. A non-transitory computer-readable storage medium with an executable program stored thereon, that when executed, instructs a processor to perform the method of claim 1.

15. The method as claimed in claim 1, wherein the second k-space row of the k-space rows along which echo signals are acquired and stored as measurement data fully covers k-space in the readout direction.

16. A magnetic resonance (MR) system for generation of measurement data from a target volume of an examination subject, the MR system comprising:
   a MR scanner; and
   a controller configured to:
      control the MR scanner to read out k-space, in a readout direction, corresponding to the target volume to acquire one set of measurement data, the reading out of k-space including:
         applying at least one radio frequency (RF) excitation pulse to excite spins in the target volume of the examination subject,
         switching gradients for spatial encoding and/or manipulating the excited spins such that echo signals generated by applied RF pulses and switched gradients can be read out along k-space rows extending in the readout direction, and
         acquiring echo signals and storing the acquired echo signals as measurement data along the k-space rows extending in the readout direction and specified by the switched gradients, wherein at least a first k-space row of the k-space rows along which echo signals are acquired and stored as measurement data does not fully cover k-space to be read out in the readout direction so that the set of stored measurement data is incomplete and at least a second k-space row of the k-space rows along which echo signals are acquired and stored as measurement data covers the k-space to be read out in locations in the readout direction at which the first k-space row does not cover the k-space to be read out;
   complete missing measurement data in the incomplete set of stored measurement data based on the measurement data of acquired echo signals so that a full set of completed measurement data is created; and
   reconstruct image data based on the set of completed measurement data.

* * * * *